US011926565B2

(12) United States Patent
Bartelt et al.

(10) Patent No.: US 11,926,565 B2
(45) Date of Patent: Mar. 12, 2024

(54) GLASS AND MELT SOLDER FOR THE PASSIVATION OF SEMICONDUCTOR COMPONENTS

(71) Applicant: SCHOTT AG, Mainz (DE)

(72) Inventors: Linda Johanna Bartelt, Landshut (DE); Antonio Trizzino, Schluchtern (DE); Julia Gold, Landshut (DE); Sabine Pichler-Wilhelm, Landshut (DE); Martin Letz, Mainz (DE); Martun Hovhannisyan, Heusenstamm (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 18/187,384

(22) Filed: Mar. 21, 2023

(65) Prior Publication Data

US 2023/0219839 A1 Jul. 13, 2023

Related U.S. Application Data

(62) Division of application No. 17/201,060, filed on Mar. 15, 2021, now Pat. No. 11,634,356.

(30) Foreign Application Priority Data

Mar. 13, 2020 (DE) .................... 10 2020 106 946.4

(51) Int. Cl.
*C03C 8/14* (2006.01)
*C03C 3/093* (2006.01)
*C03C 8/04* (2006.01)
*H01L 23/31* (2006.01)

(52) U.S. Cl.
CPC ............... *C03C 8/14* (2013.01); *C03C 3/093* (2013.01); *C03C 8/04* (2013.01); *H01L 23/3171* (2013.01)

(58) Field of Classification Search
CPC ........................................................ C03C 8/04
See application file for complete search history.

(56) References Cited

U.S. PATENT DOCUMENTS

| 4,133,690 A | 1/1979 | Muller |
| 2007/0009744 A1 | 1/2007 | Besinger |
| 2008/0161178 A1 | 7/2008 | Besinger |
| 2015/0210919 A1* | 7/2015 | Won ................. C03C 14/006 501/24 |
| 2016/0002093 A1 | 1/2016 | Ito |

FOREIGN PATENT DOCUMENTS

| CN | 108863089 | 11/2018 |
| DE | 2129638 | 1/1972 |
| DE | 102005031658 | 1/2007 |
| DE | 102006028763 | 12/2007 |
| DE | 102006062428 | 7/2008 |
| GB | 1349163 | 3/1974 |

(Continued)

*Primary Examiner* — Karl E Group
(74) *Attorney, Agent, or Firm* — Ruggiero McAllister & McMahon LLC

(57) ABSTRACT

The disclosure relates to a glass and a melt solder for the passivation of semiconductor components, the use of the glass or the melt solder for the passivation of semiconductor components, a passivated semiconductor component and a method for passivating semiconductor components.

16 Claims, 7 Drawing Sheets

(56) References Cited

FOREIGN PATENT DOCUMENTS

| | | |
|---|---|---|
| JP | S565348 | 1/1981 |
| JP | S61242928 | 10/1986 |
| JP | H10236844 | 9/1998 |
| JP | 2000016835 | 1/2000 |
| JP | 2016222498 | 12/2016 |
| JP | 2018055767 | 4/2018 |
| WO | 2018026402 | 2/2018 |

* cited by examiner

GLASS AND MELT SOLDER FOR THE PASSIVATION OF SEMICONDUCTOR COMPONENTS

CROSS-REFERENCE TO RELATED APPLICATION

The present application is a divisional of U.S. patent application Ser. No. 17/201,060 filed on Mar. 15, 2021, that claims the benefit of German Patent Application No. 10 2020 106 946.4, filed on Mar. 13, 2020, which is herein incorporated by reference.

BACKGROUND OF THE DISCLOSURE

1. Field of the Disclosure

The disclosure relates to a glass and a melt solder for the passivation of semiconductor components, the use of the glass or the melt solder for the passivation of semiconductor components, a passivated semiconductor component and a method for passivating semiconductor components.

2. Description of the Related Art

Passivating agents, in particular glasses and melt solders for the passivation of semiconductors, e.g., for the backend passivation of silicon wafers or for the frontend passivation of diodes, are known in prior art. The purpose of these glasses is the passivation of the p-n-junctions. A good passivation is characterized by a high break-through voltage and a low leakage current. Today, all passivation glasses which are used in practice contain lead. From the viewpoint of environmental protection lead should be replaced. Some lead-free passivation glasses have been described, for example in a Zn—B—Si glass system (JP S61-242928 A, JP 2016-222498 A2, DE 10 2006 062428 A1) and in a Bi—B glass system (WO 2018/026402 A1). In principle, zinc borate glasses are well suitable for passivation. But the chemical stability of these glasses is not sufficient. After the glazing of silicon wafers for the purpose of cleaning they have to be etched with an acid. For that, normally, in the semiconductor industry $HNO_3$ or HF are used. Depending on the concentration and process time it is possible that the passivation layer is considerably damaged. On the contrary, lead containing glasses show a very good resistance against these acids.

The glasses of the Zn—B—Si system have a relatively high modulus of elasticity (in the following: "E modulus"). For example, typically, the E modulus of a Zn—B—Si glass is ca. 7 GPa higher than that of a typical lead containing passivation glass. In the case of cooling this may lead to cracks. These cracks are the result of tensions in the passivation layer due to differences with respect to the thermal expansion. The average thermal expansion of polycrystalline silicon in the temperature range of 20° C. to 300° C. is ca. 3 ppm/K. In the case of lead containing glasses a mismatch of the thermal expansion due to the smaller E modulus is less critical. Furthermore, in the case of zinc borate glasses it is possible that gaps are formed. These gaps are free regions at the contact area of semiconductor and passivating agent. Such gaps are disadvantageous, because their formation cannot be controlled so that there is the risk that the p-n-junction is exposed. In the production, such a component part which is not passivated will be discarded as waste.

The higher E modulus of a zinc borate glass, in comparison to lead containing glasses, results in the case of the same mechanical movement (e.g., when the glass and the silicon are cooled together) in higher tensions in the passivating agent. It is possible that the passivation layer cracks due to the volume contraction during cooling and differences with respect to the thermal expansion. It has been shown that a mismatch of the thermal expansion of 1.1 ppm/K is already sufficient for inducing cracks in passivation layers made of zinc borate glass.

Bismuth containing glasses, besides the high costs of the raw materials, have the essential disadvantage that it is possible that bismuth during semiconductor passivation is reduced due to the oxygen-deficient atmosphere which is used there. So, bubbles are generated which at the p-n-junction lead to a component part which is not passivated.

The RoHS regulations (Restriction of Hazardous Substances; EU directive 2011/65/EU) impose a ban on lead containing glasses which only due to exceptional permissions is still not in force in all areas. The ban requires the replacement of lead containing glasses by alternatives which are free of lead. Here, it would be desired to not at all or only minimally adjust the established passivation methods to the new passivating agent. For example, a new passivating agent should have a melting temperature which is as low as possible, in particularly below 800° C., for being able to facilitate a passivation process which is as economically as possible and for being able not to endanger the stability of the silicon wafer. Furthermore, the passivating agent should not crack and should avoid the formation of gaps between component part to be passivated and passivation layer. At its best, the passivating agent also has a high resistance against acids.

It is an object of the disclosure to meet the described demand and to avoid the mentioned disadvantages.

SUMMARY OF THE DISCLOSURE

The object is solved by the herein described glasses, melt solders, semiconductor components, methods and uses.

In one embodiment, the present disclosure provides a melt solder with the following constituents in % by mole:

| | |
|---|---|
| $SiO_2$ | 15.0 to 30.0 |
| $Al_2O_3$ | 0.5 to 8.0 |
| $B_2O_3$ | 14.0 to 25.0 |
| ZnO | 40.0 to 65.0 |
| MgO | 0.1 to 8.0 | wherein the solder comprises a crystalline additive, wherein the crystalline additive contains magnesium and aluminum, and wherein the crystalline additive is present in an amount of at least 1.0% by volume of the solder.

In another embodiment, the present disclosure provides a glass powder comprising the following constituents in % by mole

| | |
|---|---|
| $SiO_2$ | 15.0 to 30.0 |
| $Al_2O_3$ | 0.0 to 8.0 |
| $B_2O_3$ | 14.0 to 25.0 |
| ZnO | 40.0 to 65.0 |
| MgO | 0.0 to 8.0 | wherein the glass powder has a particle size distribution that is characterized by a spread (d90–d10)/d50 of at least 1.00.

The present disclosure also provides a semiconductor component comprising a passivation layer made of the above-described melt solder or glass powder.

The present disclosure also provides a method for the production of a passivated semiconductor component, comprising the steps of: providing a semiconductor component; applying the above-described melt solder or glass powder to the semiconductor component; and heat treating the melt solder or glass powder, thereby generating the passivation layer.

DETAILED DESCRIPTION OF THE DISCLOSURE

Melt Solder

Figure 1:
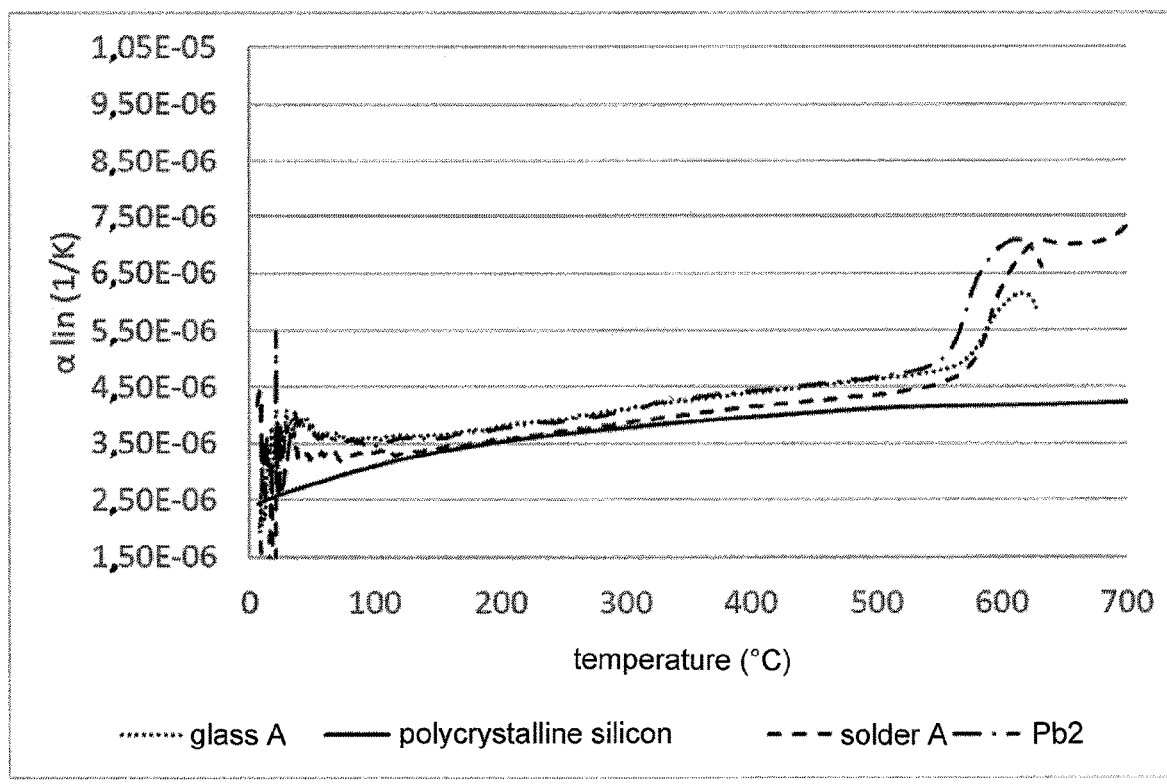
FIG. 1 shows the heat expansion of different compositions in comparison to polycrystalline silicon.
Figure 2:
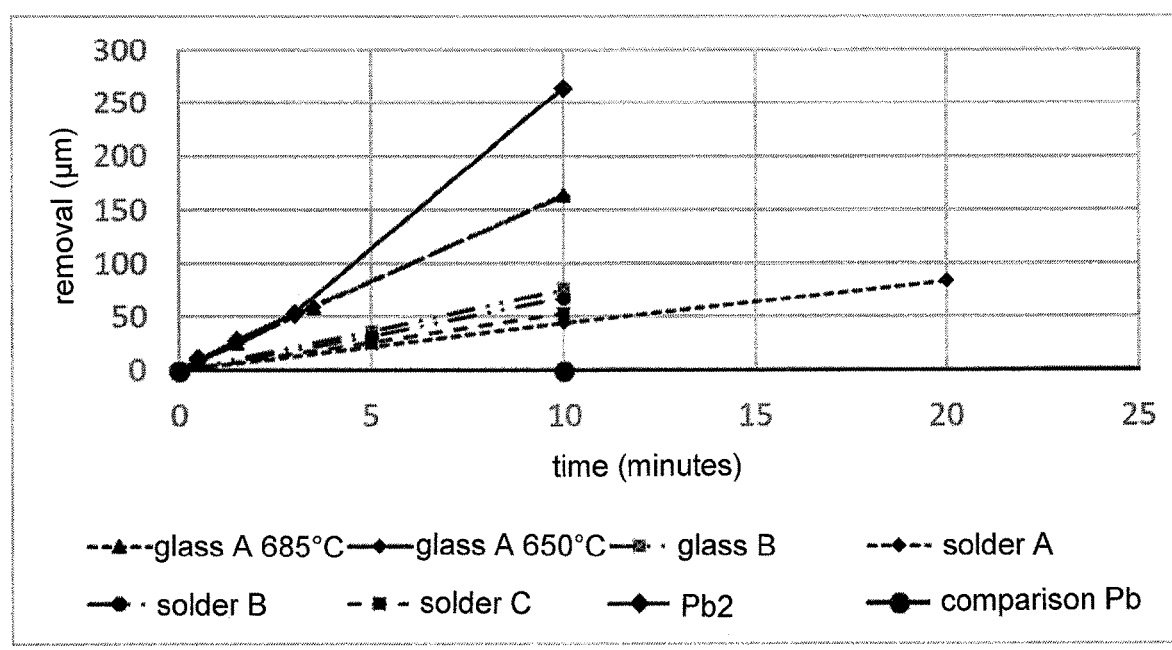
FIG. 2 shows the etching removal in 20% $HNO_3$ at 20° C. of the glasses and solders according to the present disclosure in comparison to glasses of prior art.
Figure 3:
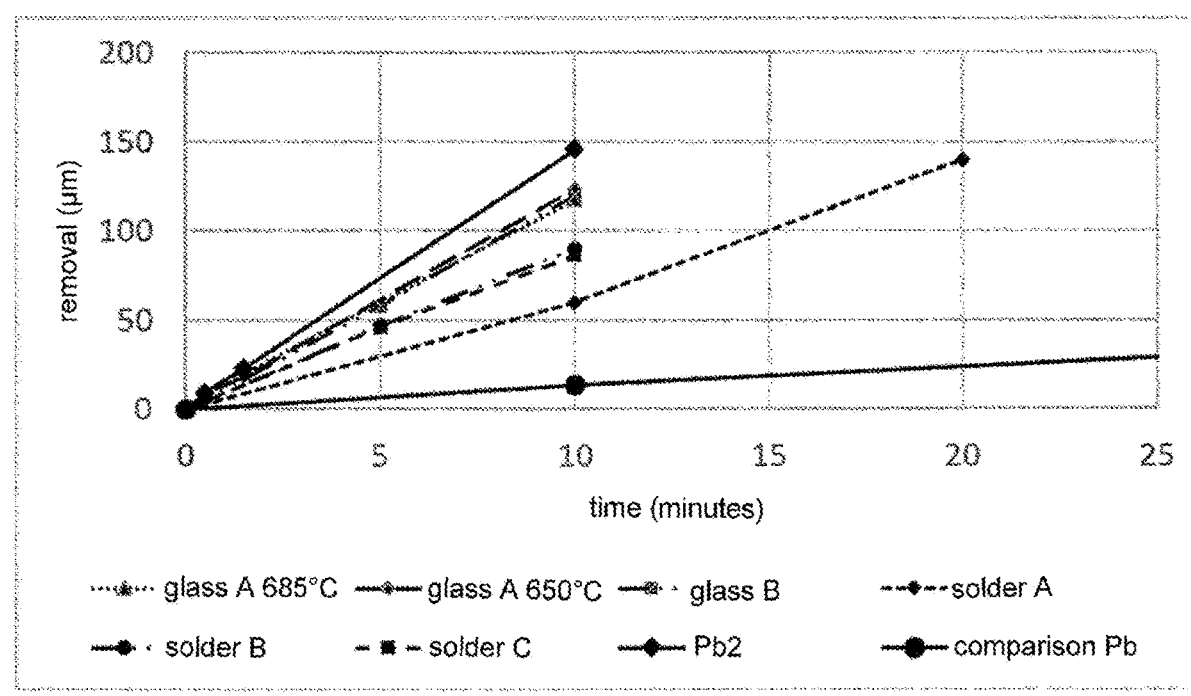
FIG. 3 shows the etching removal in 5% $HNO_3$ at 20° C. of the glasses and solders according to the present disclosure in comparison to glasses of prior art.

In one aspect the disclosure relates to a melt solder with the following constituents in % by mole

| | |
|---|---|
| $SiO_2$ | 15.0 to 30.0 |
| $Al_2O_3$ | 0.5 to 8.0 |
| $B_2O_3$ | 14.0 to 25.0 |
| ZnO | 40.0 to 65.0 |
| MgO | 0.1 to 8.0 | wherein the solder comprises a magnesium- and aluminum-containing crystalline additive in a portion of at least 1.0% by volume. It has been shown in the passivation of semiconductor components that the melt solder is less susceptible to cracks. Without being bound by theory, the present inventors believe that by the addition of the crystalline additive in the passivation a crystalline portion with crystal phases is formed, which together are responsible for the low susceptibility to cracks. It is assumed that here a relatively high amorphous portion in the passivation layer and/or a low portion of willemite play a role. The crystalline additive has to be distinguished from a crystalline portion being formed in a passivation layer which is produced from the melt solder. The crystalline additive is not necessarily present in the crystalline portion of a passivation layer after the use of the melt solder. Rather it is possible that the crystalline additive during the thermal treatment of the solder dissolves and is no longer present as a crystal phase in the passivation layer. The constituents of the melt solder given above in % by mole comprise the crystalline additive. The portion of the crystalline additive in the melt solder may be at least 2.0% by volume, at least 3.0% by volume, at least 4.0% by volume or at least 5.0% by volume. In one embodiment the portion of the crystalline additive is up to 25.0% by volume, up to 20.0% by volume, up to 17.5% by volume or up to 15.0% by volume. The crystalline additive itself is not necessarily or no longer completely present in the passivation layer which is formed from the melt solder by melting. Instead, in XRD investigations it was found that completely different crystal phases are formed. It is all the more astonishing that the crystalline additive used here has such an influence onto the formation of crystal phases in the course of the passivation. It is particularly astonishing that by the use of the crystalline additive a relatively high amorphous portion remains in the passivation layer which avoids the formation of cracks by reducing the volume contraction.

The crystalline additive contains magnesium and aluminum. In one embodiment it contains the following constituents in % by weight:

| | |
|---|---|
| magnesium | 1.0 to 15.0 |
| aluminum | 15.0 to 25.0 |
| silicon | 20.0 to 35.0 |
| oxygen | 40.0 to 65.0 |
| zinc | <5.0 |
| boron | <5.0 |

In particularly, the crystalline additive may be a magnesium-aluminum-silicate, wherein preferably the additive is $Mg_2Al_4Si_5O_{18}$.

In one embodiment the melt solder has a glass portion of at least 75.0% by volume and/or at most 99.0% by volume. Here the glass portion is meant, before the melt solder is used for the passivation. In particularly, the melt solder is in powder form. It can, for example, be obtained by mixing a glass powder with the crystalline additive. The melt solder may substantially consist of the glass portion and the crystalline additive. In particularly, the portion of further components besides the glass portion and the crystalline additive may be limited to at most 10.0% by volume, at most 5.0% by volume, at most 2.5% by volume, at most 1.0% by volume or at most 0.5% by volume. In one embodiment the melt solder comprises a portion of the glass based on the melt solder of at least 80.0% by volume. In one embodiment the portion of the glass in the melt solder is at least 85.0% by volume or at least 87.5% by volume. The portion may optionally be up to 90% by volume. The melt solder may consist of the glass and the crystalline additive.

The melt solder may be present in form of a powder. It has been found that the selection of the particle size and the particle size distribution has an influence onto the formation of crystal phases in the production of a passivation layer on a semiconductor component. Furthermore, it is possible to influence the acid resistance and the formation of gaps by the selection of the particle size and its distribution. In one embodiment the disclosure relates to a melt solder with a particle size distribution which is characterized by a spread (d90–d10)/d50 of at least 1.00, in particularly at least 1.80. A higher spread resulted in a better packing density and thus in a lower tendency of the melt solder to form gaps between the layer and the semiconductor component in the heat treatment during the formation of a passivation layer. But the spread should also not be too high, because it is possible that this reduces the acid resistance. The spread may be limited to at most 6.00, at most 4.50 or at most 3.50, in particularly at most 3.00.

In one embodiment the mean particle size d50 of the melt solder is 1.0 µm to 10.0 µm, in particularly 1.5 µm to 5.0 µm or 2.0 µm to 3.0 µm. It has been shown that this particle size preferably in combination with the above-mentioned spread combines optimum results with respect to acid resistance, crystal formation and shrinkage during the passivation.

In one embodiment the volume portion of particles with sizes below 1.0 µm is limited to at most 30% by volume of the melt solder, in particularly at most 27.0% by volume or at most 20.0% by volume of the melt solder. So, a better acid resistance and less gaps in the passivation layer are achieved.

In one embodiment the information on the particle size and/or particle size distribution equally applies to the glass portion and the crystalline additive.

The particle sizes and particle size distributions given in this description were measured by means of dynamic light scattering, wherein, e.g., it is possible to use the method in ISO 13320:2009. For the interpretation the Fraunhofer method may be used, and the measured values can be illustrated as volume distribution.

In one embodiment the average thermal expansion of the melt solder in the temperature range of 20° C. to 300° C. is less than $4.5*10^{-6}$ $K^{-1}$, or less than $4.10*10^{-6}$ $K^{-1}$, in particularly 3.50 to 4.10 ppm/K, preferably higher than $3.5*10^{-6}K^{-1}$. The thermal expansion is in particularly measured at a test specimen of 5×5×50 mm after melting-down of the solder at a temperature of 700 to 750° C. It has been shown that this thermal expansion is adequately adjusted to the expansion of silicon for avoiding cracks in the passivation layer.

In one embodiment the melt solder shows a average thermal expansion which in a temperature range of 300° C. to Tg−20° C. does not differ from the average thermal expansion of polycrystalline silicon by more than 0.65 ppm/K, wherein Tg is the glass-transition temperature of a glass portion which is contained in the solder and the thermal expansion is measured at a test specimen of 5×5×50 mm after melting-down of the solder at a temperature of 700 to 750° C.

Of particular importance with respect to the average thermal expansion of the melt solder is the temperature range of 300° C. to Tg of the glass. Here, the upper endpoint is chosen at Tg−20° C., because the measurement exactly at Tg only leads to inexact results. As can be seen in FIG. 1, in the temperature range of up to 300° C. the expansions of different glasses and/or melt solders and of the semiconductor material are still substantially synchronous. Only at temperatures of higher than 300° C. it becomes more difficult to limit the deviations with respect to the expansion coefficient. In the range around Tg which for this disclosure is in particularly at least 550° C. the expansion becomes totally different. Above Tg a difference with respect to the thermal expansion is not relevant, because the glass and/or the melt solder beyond Tg are ductile. Preferably, the melt solder may have a average thermal expansion which in a temperature range of 300° C. to Tg−20° C. does not differ from the average thermal expansion of polycrystalline silicon by more than $0.50*10^{-6}$ $K^{-1}$. A certain difference with respect to the average thermal expansion of the glass in comparison to the polycrystalline silicon can hardly be avoided. The difference with respect to the average thermal expansion may be at least $0.05*10^{-6}$/K or at least $0.09*10^{-6}$/K. Such a difference with respect to the expansion behavior is still acceptable due to the adjusted E modulus. The thermal expansion behavior of polycrystalline silicon is known to a person skilled in the art. It can also be learned from FIG. 1.

In a preferred embodiment the melt solder shows a mean coefficient of thermal expansion in the temperature range of 300° C. to Tg−20° C. of $0.2*10^{-6}$ $K^{-1}$ to $1.0*10^{-6}$ $K^{-1}$.

In one embodiment the melt solder shows a low crystal formation after heat treating of the solder at a temperature of 700 to 750° C., namely with a crystalline portion of at most 40.0% by weight, determined by means of X-ray diffraction and Rietveld simulation. The crystalline portion mentioned here relates to the crystal phases which are formed after the heat treatment of the solder at a temperature which is typical for the production of a passivation layer. In the course of the heat treatment the melt solder can partially or completely melt. In one embodiment the melt solder completely melts during the heat treatment. The crystalline portion should not be confused with the crystalline additive which is a constituent of the melt solder. The crystalline additive may form a part of the crystalline portion, but this is not always the case. In particularly it may be possible that in the passivation layer other crystal phases than that of the crystalline additive are present. In one embodiment the crystalline portion is smaller than 35.0% by weight or smaller than 20.0% by weight. With a low crystalline portion, the formation of cracks in a passivation layer can be reduced. It is astonishing that the crystalline portion can be adjusted by the addition of an above-described crystalline additive to the melt solder. Here, the crystalline portion decreases with an increasing portion of crystalline additive in the melt solder.

In one embodiment the melt solder shows a low tendency after melting of the solder at a temperature of 700 to 750° C. to form willemite, namely with a willemite portion of at most 20% by weight, determined by means of X-ray diffraction and Rietveld simulation. A low tendency to form willemite is advantageous for reducing the formation of cracks during passivation. The tendency is reduced by the use of the crystalline additive described here in the melt solder.

The composition features discussed here make a contribution to the advantageous properties of the melt solder. It has been found that in particular an optimization of the contents of $SiO_2$, ZnO and $B_2O_3$ in view of particularly advantageous properties with respect to both, the E modulus and also the average thermal expansion, in comparison to polycrystalline silicon can be achieved. It has been shown that one or several of the following measures and/or fine tunings of the amount of a certain component in relation to each other make a contribution for promoting the properties which are desired according to the present disclosure with respect to E modulus, thermal expansion, crystallization and chemical resistance.

In one embodiment the ratio of the sum of the contents of $B_2O_3$ and ZnO to $SiO_2$, each in % by mole, in the melt solder is less than 7.0 or less than 5.5, in particularly less than 4.0. In one embodiment the mentioned ratio is at least 2.0, at least 2.5 or at least 3.0.

The sum of the contents of $SiO_2$ and ZnO in the melt solder may be at least 73.0% by mole, in particularly at least 74.0% by mole. In one embodiment the content of these components together is limited to at most 85.0% by mole, at most 80.0% by mole or up to 79.0% by mole.

In one embodiment the ratio of the sum of the contents of ZnO and $SiO_2$ to $B_2O_3$, each in % by mole, in the melt solder is less than 8.0 or less than 6.0, in particularly less than 5.0. In one embodiment the mentioned ratio is at least 3.0, at least 3.5 or at least 4.0.

The melt solder may comprise a content of ZnO of at most 65.0% by mole, at most 63.0% by mole, or at most 61.0% by mole. In one embodiment the content is at least 40.0% by mole, at least 42.0% by mole or at least 45.0% by mole. This component makes a contribution to the advantageous expansion behavior. In the case of higher contents of ZnO the thermal expansion and the E modulus decrease. In the case of lower contents both, the thermal expansion and also the glass-transition temperature Tg, strongly increase.

The melt solder may have a content of $B_2O_3$ of at most 25.0% by mole, at most 23.0% by mole or at most 22.0% by mole. In one embodiment the content is at least 14.0% by mole, at least 15.0% by mole or at least 16.0% by mole. This component makes a contribution to the chemical stability of the melt solder. In the case of higher contents of $B_2O_3$ the E modulus decreases, the thermal expansion and the glass-transition temperature increase. In the case of lower contents both, the thermal expansion and also the glass-transition temperature Tg, strongly decrease, the E modulus increases.

In one embodiment the melt solder has a content of $SiO_2$ of at least 15.0% by mole, at least 16.0% by mole or at least 16.5% by mole. Optionally, the content can be at most 30.0% by mole, in particularly at most 28.0% by mole or at most 27.0% by mole. A content of $SiO_2$ which is too high has a negative influence onto the E modulus and results in high melting temperatures, in particularly in a high Tg. When the contents of $SiO_2$ are higher, then the E modulus slightly decreases, the thermal expansion and the glass-transition temperature slightly increase. In the case of lower contents, the glass-transition temperature Tg slightly decreases, the E modulus slightly increases. Optionally, the ratio of the portions in mole percent of $SiO_2$ to $B_2O_3$ is at least 0.75, at least 0.85 or at least 0.875. In one embodiment the mentioned ratio is 0.75 to 1.40, 0.80 to 1.30 or 0.85 to 1.25. In one embodiment the mentioned ratio is higher than 1.0; in another embodiment it is lower than 1.0.

In one embodiment the melt solder contains $Al_2O_3$. The content may be at least 0.5% by mole, at least 0.6% by mole or at least 0.7% by mole. Optionally, the content is limited to at most 8.0% by mole, at most 7.5% by mole or up to 6.0% by mole. When too much $Al_2O_3$ is used, then the E modulus increases. $Al_2O_3$ can be introduced via the crystalline additive, and then it shows the effects which are described here for the crystalline additive.

The melt solder may contain MgO, in particularly in a portion of at least 0.1% by mole, at least 0.15% by mole or at least 0.2% by mole. In one embodiment the content of MgO is limited to at most 8.0% by mole, at most 7.0% by mole or at most 6.0% by mole. MgO can be introduced via the crystalline additive, and then it shows the effects which are described here for the crystalline additive.

In one embodiment the melt solder and/or the glass contains certain components at the most in very low amounts and in particularly not at all. For example, the content of Na, K, Li, Cs, Rb, Cu, Ag, Hg, Cd, Ce, Ti, Mo, Bi, V, Mn, Co, Ni, Cr and/or Fe can be limited to at most 100 ppm, or the melt solder can be free of these components. In one embodiment the melt solder contains less than 1.0% by mole of $Bi_2O_3$, less than 100 ppm of PbO, less than 50 ppm of $As_2O_3$ and/or less than 50 ppm of $Sb_2O_3$.

When in this description is mentioned that the glasses or the melt solder are free of a component or that they do not contain a certain component, then this means that for this component it is at the most allowed to be present as an impurity. This means that it is not added in substantial amounts and it is not intentionally added. Not substantial amounts are amounts of less than 100 ppm, preferably less than 50 ppm and most preferably less than 10 ppm. In one embodiment the glasses and/or melt solders which are described here are free of constituents which are not mentioned here. In particular, the glasses and/or melt solders may consist of $SiO_2$, $Al_2O_3$, $B_2O_3$, ZnO and MgO in a total amount of at least 90% by mole, at least 95% by mole, at least 97.5% by mole or at least 99% by mole. In one embodiment the melt solder and/or the glass is free of Bi and/or free of Cu. In an alternative or in addition, the melt solder and/or the glass is free of Mo, Ti and/or free of Ce.

In one embodiment the melt solder comprises the following components in % by mole:

| | |
|---|---|
| $SiO_2$ | 15.0 to 28.0 |
| $Al_2O_3$ | 0.6 to 7.5 |
| $B_2O_3$ | 15.0 to 23.0 |
| ZnO | 42.0 to 63.0 |
| MgO | 0.1 to 7.0 |

In one embodiment the melt solder comprises the following components in % by mole:

| | |
|---|---|
| $SiO_2$ | 16.0 to 27.0 |
| $Al_2O_3$ | 0.7 to 6.0 |
| $B_2O_3$ | 16.0 to 22.0 |
| ZnO | 45.0 to 61.0 |
| MgO | 0.2 to 6.0 |

Preferably, the melt solder has an etching rate of less than 10.0 μm/min in 20% $HNO_3$ and/or less than 15.0 μm/min in 5% HF at 20° C. Etching rates which are too high may have a negative influence onto the passivation layers, because it is possible that the passivated components during the production of the semiconductor components are subjected to the influence of $HNO_3$ and/or HF for cleaning purposes. In an advantageous embodiment the etching rate in 20% $HNO_3$ at room temperature is less than 8.5 μm/min, less than 7.5 μm/min or less than 7.0 μm/min. The melt solder may have an etching rate in 20% $HNO_3$ at room temperature of at least 2.0 μm/min or at least 3.0 μm/min. An advantageous melt solder shows an etching rate in 5% HF at room temperature of less than 14.0 μm/min or less than 12.5 μm/min. The etching rate in 5% HF at room temperature may be at least 5.0 μm/min or at least 8.0 μm/min. It has been shown that these etching rates are sufficient, although they do not completely reach the chemical stability of lead containing melt solders.

The etching rate can be determined as follows. For determining the etching rates, the samples were melted (e.g., at 650 to 750° C.), cast into a mold, cut into plates and polished to a thickness of 3 mm. Subsequently, the samples were subjected at room temperature to the mentioned aqueous acids, and after 10 minutes the etching removal was measured. The etching removal is determined with the help of the weight loss and converted to the sample surface.

The glass-transition temperature Tg of the melt solder can be at least 500° C., at least 550° C., at least 560° C. or at least 570° C. In one embodiment Tg is not higher than 750° C., less than 700° C., less than 650° C. or up to 600° C. In the case of a Tg which is too high it may be possible that the melt solder cannot be used in the conventional passivation process. The softening temperature, thus the temperature at which the solder has a viscosity of $10^{7.6}$ dPas, may be in the range of 600° C. to 800° C., in particular in the range of 700° C. to 800° C., preferably above 750° C.

For minimizing jumps and discontinuities in the electrical field profile it is better to keep the difference with respect to the relative permittivity ($\varepsilon_r$) between semiconductor material and melt solder as small as possible. The relative permittivity ($\varepsilon_{si}$) of crystalline silicon is 11.68. Preferably, the absolute value of the difference of the relative permittivities of silicon and of the melt solder $|\varepsilon_r-\varepsilon_{si}|$ is less than 6.0, less than 5.0 or less than 4.0.

Glass

In a further aspect the disclosure relates to a glass in form of a glass powder comprising the following constituents in % by mole

| | |
|---|---|
| $SiO_2$ | 15.0 to 30.0 |
| $Al_2O_3$ | 0.0 to 8.0 |
| $B_2O_3$ | 14.0 to 25.0 |
| ZnO | 40.0 to 65.0 |
| MgO | 0.0 to 8.0 | with a particle size distribution which is characterized by a spread (d90–d10)/d50 of at least 1.00, in particular at least 1.80. It has been shown that glasses with this composition and spread of the particle size show particularly well acid resistance and due to the advantageous packing density show only low shrinkage.

The glass may be the glass which forms the glass portion in the melt solder described above. In one embodiment the glass does not comprise a crystalline additive.

The glass is present in form of a powder. It has been found that the selection of the particle size and the particle size distribution has an influence onto the formation of crystal phases in the production of a passivation layer on a semiconductor component. Furthermore, it is possible to influence the acid resistance and the formation of gaps by the selection of the particle size and its distribution. In one embodiment the disclosure relates to a glass with a particle size distribution which is characterized by a spread (d90–d10)/d50 of at least 1.00, in particular at least 1.80. A higher spread resulted in a better packing density and thus in a lower tendency of the glass to form gaps between the layer and the semiconductor component, when it was melted down during the formation of a passivation layer. But the spread should also not be too high, because it is possible that this reduces the acid resistance. The spread may be limited to at most 6.00, at most 4.50 or at most 3.50, in particularly at most 3.00.

In one embodiment the mean particle size d50 of the glass is 1.0 µm to 10.0 µm, in particularly 1.5 µm to 5.0 µm or 2.0 to 3.0 µm. It has been shown that this particle size preferably in combination with the above-mentioned spread combines optimum results with respect to acid resistance, crystal formation and shrinkage during the passivation.

In one embodiment the volume portion of particles with sizes below 1.0 µm is limited to at most 30% by volume of the glass, in particularly at most 27.0% by volume or at most 20.0% by volume of the glass. So, a better acid resistance and less gaps in the passivation layer are achieved.

In one embodiment the average thermal expansion of the glass in the temperature range of 20° C. to 300° C. is less than $4.5*10^{-6}$ $K^{-1}$, or less than $4.10*10^{-6}$ $K^{-1}$, in particularly 3.50 to 4.10 ppm/K, preferably higher than $3.5*10^{-6}$ $K^{-1}$. The thermal expansion is in particularly measured at a test specimen of 5×5×50 mm after melting-down of the glass at a temperature of 700 to 750° C. It has been shown that this thermal expansion is adequately adjusted to the expansion of silicon for avoiding cracks in the passivation layer.

In one embodiment the glass shows a average thermal expansion which in a temperature range of 300° C. to Tg–20° C. does not differ from the average thermal expansion of polycrystalline silicon by more than 0.90 ppm/K, wherein Tg is the glass-transition temperature of the glass and the thermal expansion can be measured at a test specimen of 5×5×50 mm after melting-down of the glass at a temperature of 700 to 750° C.

Of particular importance with respect to the average thermal expansion of the glass is the temperature range of 300° C. to Tg. Here, the upper endpoint is chosen at Tg–20° C., because the measurement exactly at Tg only leads to inexact results. As can be seen in FIG. 1, in the temperature range of up to 300° C. the expansions of different glasses and/or melt solders and of the semiconductor material are still substantially synchronous. Only at temperatures of higher than 300° C. it becomes more difficult to limit the deviations with respect to the expansion coefficients. In the range around Tg which for the glasses of this disclosure is in particularly at least 550° C. the expansion becomes totally different. Above Tg a difference with respect to the thermal expansion is not relevant, because the glass beyond Tg is ductile. Preferably, the glass may have a average thermal expansion which in a temperature range of 300° C. to Tg–20° C. does not differ from the average thermal expansion of polycrystalline silicon by more than $0.75*10^{-6}$ $K^{-1}$. A certain difference with respect to the average thermal expansion of the glass in comparison to the polycrystalline silicon can hardly be avoided. The difference with respect to the average thermal expansion may be at least $0.10*10^{-6}$/K or at least $0.30*10^{-6}$/K. Such a difference with respect to the expansion behavior is still acceptable due to the adjusted E modulus. The thermal expansion behavior of polycrystalline silicon is known to a person skilled in the art. It can also be learned from FIG. 1.

In a preferred embodiment the melt solder shows a mean coefficient of thermal expansion in the temperature range of 300° C. to Tg–20° C. of $0.2*10^{-6}$ $K^{-1}$ to $1.0*10^{-6}$ $K^{-1}$.

The glass may have a glass-transition temperature Tg of at least 550° C., at least 560° C. or at least 570° C.

Preferably, the glass has an etching rate of less than 10.0 µm/min in 20% $HNO_3$ and/or less than 15.0 µm/min in 5% HF at 20° C. Etching rates which are too high may have a negative influence onto the passivation layers, because it is possible that the passivated components during the production of the semiconductor components are subjected to the influence of $HNO_3$ and/or HF for cleaning purposes. In an advantageous embodiment the etching rate in 20% $HNO_3$ at room temperature is less than 8.5 µm/min, less than 7.5 µm/min or less than 7.0 µm/min. The glass may have an etching rate in 20% $HNO_3$ at room temperature of at least 2.0 µm/min or at least 3.0 µm/min. An advantageous glass shows an etching rate in 5% HF at room temperature of less than 14.0 µm/min or less than 12.5 µm/min. The etching rate in 5% HF at room temperature may be at least 5.0 µm/min or at least 8.0 µm/min. It has been shown that these etching rates are sufficient, although they do not completely reach the chemical stability of lead containing melt solders.

The etching rate can be determined as follows. For determining the etching rates, the samples were melted (e.g., at 650 to 750° C.), cast into a mold, cut into plates and polished to a thickness of 3 mm. Subsequently, the samples were subjected at room temperature to the mentioned aqueous acids, and after 10 minutes the etching removal was measured. The etching removal is determined with the help of the weight loss and converted to the sample surface.

The composition features discussed here make a contribution to the advantageous properties of the glass. It has been found that in particularly an optimization of the contents of $SiO_2$, ZnO and $B_2O_3$ in view of particularly advantageous properties with respect to both, the E modulus and also the average thermal expansion, in comparison to polycrystalline silicon can be achieved. It has been shown that one or several of the following measures and/or fine tunings of the amount of a certain component in relation to each other make a contribution for promoting the properties which are desired according to the present disclosure with respect to E modulus, thermal expansion, crystallization and chemical resistance.

In one embodiment the ratio of the sum of the contents of $B_2O_3$ and ZnO to $SiO_2$, each in % by mole, in the melt solder is less than 7.0 or less than 5.5, in particularly less than 4.0. In one embodiment the mentioned ratio is at least 2.0, at least 2.5 or at least 3.0.

The sum of the contents of $SiO_2$ and ZnO in the glass may be at least 73.0% by mole, in particularly at least 74.0% by mole. In one embodiment the content of these components together is limited to at most 85.0% by mole, at most 80.0% by mole or up to 79.0% by mole.

In one embodiment the ratio of the sum of the contents of ZnO and $SiO_2$ to $B_2O_3$, each in % by mole, in the glass is less than 8.0 or less than 6.0, in particularly less than 5.0. In one embodiment the mentioned ratio is at least 3.0, at least 3.5 or at least 4.0.

The glass may comprise a content of ZnO of at most 65.0% by mole, at most 63.0% by mole, or at most 61.0% by mole. In one embodiment the content is at least 40.0% by mole, at least 42.0% by mole or at least 45.0% by mole. This component makes a contribution to the advantageous expansion behavior. In the case of higher contents of ZnO the thermal expansion and the E modulus decrease. In the case of lower contents both, the thermal expansion and also the glass-transition temperature Tg, strongly increase.

The glass may have a content of $B_2O_3$ of at most 25.0% by mole, at most 23.0% by mole or at most 22.0% by mole. In one embodiment the content is at least 14.0% by mole, at least 15.0% by mole or at least 16.0% by mole. This component makes a contribution to the chemical stability of the glass. In the case of higher contents of $B_2O_3$ the E modulus decreases, the thermal expansion and the glass-transition temperature increase. In the case of lower contents both, the thermal expansion and also the glass-transition temperature Tg, strongly decrease, the E modulus increases.

In one embodiment the glass has a content of $SiO_2$ of at least 15.0% by mole, at least 16.0% by mole or at least 16.5% by mole. Optionally, the content can be at most 30.0% by mole, in particularly at most 28.0% by mole or at most 27.0% by mole. A content of $SiO_2$ which is too high has a negative influence onto the E modulus and results in high melting temperatures, in particularly in a high Tg. When the contents of $SiO_2$ are higher, then the E modulus slightly decreases, the thermal expansion and the glass-transition temperature slightly increase. In the case of lower contents, the glass-transition temperature Tg slightly decreases, the E modulus slightly increases. Optionally, the ratio of the portions in mole percent of $SiO_2$ to $B_2O_3$ is at least 0.75, at least 0.85 or at least 0.875. In one embodiment the mentioned ratio is 0.75 to 1.40, 0.80 to 1.30 or 0.85 to 1.25. In one embodiment the mentioned ratio is higher than 1.0; in another embodiment it is lower than 1.0.

In one embodiment the glass contains $Al_2O_3$. The content may be at least 0.0% by mole, at least 0.5% by mole, at least 0.6% by mole or at least 0.7% by mole. Optionally, the content is limited to at most 8.0% by mole, at most 7.5% by mole or up to 6.0% by mole. When too much $Al_2O_3$ is used, then the E modulus increases.

The glass may contain MgO, in particular in a portion of at least 0.0% by mole, at least 0.1% by mole or at least 0.2% by mole. In one embodiment the content of MgO is limited to at most 8.0% by mole, at most 7.0% by mole or at most 6.0% by mole. In one embodiment the glass is free of MgO.

In one embodiment the glass contains certain components at the most in very low amounts and in particularly not at all. For example, the content of Na, K, Li, Cs, Rb, Cu, Ag, Hg, Cd, Cr and/or Fe can be limited to at most 100 ppm, or the glass can be free of these components. In one embodiment the glass contains less than 1.0% by mole of $Bi_2O_3$, less than 100 ppm of PbO, less than 50 ppm of $As_2O_3$ and/or less than 50 ppm of $Sb_2O_3$.

The glass-transition temperature Tg of the glass can be at least 500° C. or at least 550° C. In one embodiment Tg is not higher than 750° C., less than 700° C., less than 650° C. or up to 600° C. In the case of a Tg which is too high it may be possible that the glass cannot be used in the conventional passivation process. The softening temperature, thus the temperature at which the glass has a viscosity of $10^{7.6}$ dPas, may be in the range of 600° C. to 800° C., in particularly in the range of 700° C. to 800° C., preferably above 750° C.

Furthermore, it has been found that with the use of the glass and/or melt solder of this disclosure positive leakage currents through the volume of the passivation layer are developed. These currents are suitable for avoiding field peaks. Contrary to creepage currents at the interface of passivation layer and semiconductor, these leakage currents thus are advantageous. Since there is a potential drop at the p-n-junction of up to 1.6 kV, a very high field strength is generated in a very small area. The glass and the melt solder of this disclosure cope with these requirements.

For minimizing jumps and discontinuities in the electrical field profile it is better to keep the difference with respect to the relative permittivity ($\varepsilon_r$) between semiconductor material and glass as small as possible. The relative permittivity ($\varepsilon_{Si}$) of crystalline silicon is 11.68. Preferably, the absolute value of the difference of the relative permittivities of silicon and of the melt solder $|\varepsilon_r - \varepsilon_{Si}|$ is less than 6.0, less than 5.0 or less than 4.0.

Use, Method and Semiconductor Component

Also the use of a glass described here or the melt solder described here for the passivation of semiconductor component parts, in particularly of silicon wafers, thyristors, varistors or diodes, is according to the present disclosure.

The disclosure also comprises a semiconductor component, in particularly a wafer or a diode, comprising at least one passivation layer made of a glass described here or a melt solder described here. The passivation layer may in particularly be applied with a thickness of 10 μm to 100 μm, in particularly of 20 μm to 80 μm or of 20 to 50 mm.

In one embodiment the disclosure comprises a method for the production of a passivated semiconductor component, comprising the steps of:
  providing a semiconductor component, in particularly wafer, thyristor, varistor or diode,
  heat treating, in particularly melting, a glass described here or a melt solder for generating at least one passivation layer.

In one embodiment the temperature during the heat treatment is in the range of 600° C. to <800° C., in particular at 625° C. to 750° C. These higher temperatures have a positive influence onto the chemical stability, because the higher temperatures result in a more homogenous melting body and the elimination of the grain boundaries so that the corroding surface for the acids is reduced.

Prior to the production of the passivation layer the glass and/or melt solder can be mixed with highly disperse silicon dioxide as stabilizer for avoiding the sedimentation of the passivating agent in a mixture with water. In an alternative or in addition, a nitrate can be added for accelerating the burning out of binder.

EXAMPLES

The given particle sizes and particle size distributions were measured by means of dynamic light scattering.

Glasses

The following table shows glasses A and B according to the present disclosure as well as different comparative glasses of prior art in % by mole. The glasses do not have a crystalline portion.

The measurement of the thermal expansion CTE was conducted at a remelted powder. Here, the samples were melted at 650 to 750° C. as slightly compacted bulk material. The samples which resulted therefrom were sawed to a rod and polished. The final size was 5×5×50 mm. The measurements were conducted at air with a heating rate of 5 K/min.

Solders

The following table shows melt solders A to C according to the present disclosure and such ones of prior art in % by mole.

TABLE 2

|  | Solder A | Solder B | Solder C | Comparison Pb |
|---|---|---|---|---|
| $SiO_2$ | 22.6 | 20.8 | 22.6 | 58.0 |
| $Al_2O_3$ | 3.0 | 1.7 | 3.0 | 8.8 |
| $B_2O_3$ | 18.3 | 19.4 | 18.3 | 12.0 |
| $Bi_2O_3$ | 0 | 0 | 0 | 0 |
| PbO | 0 | 0 | 0 | 13.3 |
| ZnO | 53.3 | 56.8 | 53.3 | 0 |
| MgO | 2.8 | 1.3 | 2.8 | 7.8 |
| $CeO_2$ | 0.0 | 0.0 | 0.0 | 0.0 |

TABLE 1

|  | Glass A | Glass B | Comparison Bi | Comparison Pb 1 | Comparison Pb 2 |
|---|---|---|---|---|---|
| $SiO_2$ | 18.6 | 18.6 | 12.9 | 58.9 | 12.9 |
| $Al_2O_3$ | 0.4 | 0.4 | 0 | 2.7 | 0 |
| $B_2O_3$ | 20.6 | 20.6 | 27.1 | 18.1 | 26.9 |
| $Bi_2O_3$ | 0 | 0 | 0.5 | 0 | 0.02 |
| PbO | 0 | 0 | 0 | 20.3 | 1 |
| ZnO | 60.4 | 60.4 | 59.1 | 0 | 58.78 |
| MgO | 0 | 0 | 0 | 0 | 0 |
| $CeO_2$ | 0 | 0 | 0.3 | 0 | 0.3 |
| $Sb_2O_3$ | 0 | 0 | 0.1 | 0 | 0.1 |
| $As_2O_3$ | 0 | 0 | 0 | 0 | 0 |
| sum | 100.0 | 100.0 | 100.0 | 100.0 | 100.0 |
| crystalline additive [% by volume] | 0.0 | 0.0 | 0.0 | 0.0 | 0.0 |
| $SiO_2 + ZnO$ | 79.0 | 79.0 | 72.0 | 58.9 | 71.68 |
| $(SiO_2 + ZnO)/B_2O_3$ | 3.83 | 3.83 | 2.66 | 3.25 | 2.66 |
| $(B_2O_3 + ZnO)/SiO_2$ | 4.35 | 4.35 | 6.68 | 0.31 | 6.64 |
| Properties |  |  |  |  |  |
| d50 [μm] | 7.2 | 1.5 | 7.4 | 8.5 | 7.5 |
| particle <1 μm [% by volume] | 10.9 | 25.3 | n.d. | n.d. | n.d. |
| spread (d90 − d10)/d50 | 3.7 | 1.6 | n.d. | n.d. | n.d. |
| density [g/cm³] | 3.7 | 3.45 | 3.85 | 3.56 | 3.88 |
| CTE 20-300° C. [ppm/K] | 4.0 | 2.75 | 4.35 | 4.8 | 4.5 |
| $T_g$ [° C.] | 569 | 574 | 557 | 463 | 641 |
| $T_{7.6}$ [° C.] | 626 | 796 | 599 | 540 | 632 |
| rel. permittivity at 25° C. [$\varepsilon_r$] | 9.07 | 7.96 | 6.98* | 7.88 | 7.77 |
| tan d at 25° C. [$10^{-4}$] | 15.5 | 15.4 | 15.3* | 8.89 | 13.3 |
| rel. permittivity at 150° C. [$\varepsilon_r$] | 9.33 | 8.19 | 7.16* | 7.99 | 8.01 |
| tan d at 150° C. [$10^{-4}$] | 11.1 | 10.9 | 7.45* | 9.01 | 11.0 |

*measured at a molten powder with d50 = 3.45 μm

TABLE 2-continued

|  | Solder A | Solder B | Solder C | Comparison Pb |
|---|---|---|---|---|
| $Sb_2O_3$ | 0.0 | 0.0 | 0.0 | 0.0 |
| $As_2O_3$ | 0.0 | 0.0 | 0.0 | 0.0 |
| sum | 100.0 | 100.0 | 100.0 | 100.0 |
| crystalline additive [% by volume] | 14.3 | 7.3 | 14.3 | 31.7 |
| $SiO_2 + ZnO$ | 75.9 | 77.6 | 75.9 | 58.0 |
| $(SiO_2 + ZnO)/B_2O_3$ | 4.15 | 4.00 | 4.15 | 4.83 |
| $(B_2O_3 + ZnO)/SiO_2$ | 3.17 | 3.66 | 3.17 | 0.21 |
| Properties | | | | |
| d50 [µm] | 1.5 | 2.5 | 2.5 | 2.5 |
| particle <1 µm [% by volume] | 25.7 | 18.4 | 18.7 | n.d. |
| spread (d90 − d10)/d50 | 1.5 | 2.1 | 2.0 | n.d. |
| CTE 20-300° C. [ppm/K] | 3.9 | 3.9 | 3.8 | 4.1 |
| $T_g$ [° C.] | 576 | 575 | 575 | 440 |
| $T_{7.6}$ [° C.] | 767 | 795 | 785 | 660 |
| rel. permittivity at 25° C. [$\varepsilon_r$] | 7.59 | 7.39 | 7.37 | 6.6 |
| tan d at 25° C. [$10^{-4}$] | 11.2 | 9.45 | 9.93 | 9.81 |
| rel. permittivity at 150° C. [$\varepsilon_r$] | 7.78 | 7.58 | 7.56 | 6.68 |

TABLE 2-continued

|  | Solder A | Solder B | Solder C | Comparison Pb |
|---|---|---|---|---|
| tan d at 150° C. [$10^{-4}$] | 9.91 | 8.83 | 9.10 | 8.84 |

The measurement of the thermal expansion CTE was conducted at a remelted powder. Here, the samples were melted at 650 to 750° C. as slightly compacted bulk material. The samples which resulted therefrom were sawed to a rod and polished. The final size was 5×5×50 mm. The measurements were conducted at air with a heating rate of 5 K/min.

Heat Expansion

The following table represents the heat expansion of a glass and a melt solder of this disclosure in comparison to silicon.

TABLE 3

|  | Glass A | Solder A |
|---|---|---|
| α at 549° C. [ppm/K] | 4.80 | 4.56 |
| difference to α(Si) [ppm/K] | 0.64 | 0.40 |
| α at 300° C. [ppm/K] | 4.14 | 3.87 |
| difference to α(Si) [ppm/K] | 0.37 | 0.10 |

FIG. 1 illustrates the thermal expansion of the glasses and solders according to the present disclosure in comparison to silicon and to a conventional bismuth containing glass. The glasses according to the present disclosure, in particularly around Tg (ca. 571° C.), show a considerably lower deviation of the thermal expansion in comparison to silicon, and this without the risk of elemental bismuth in the passivation.

Etching Rates

The following table shows the determined etching rates of glasses according to the present disclosure and glasses of prior art. For determining the etching rates, the samples were melted at the given melting temperatures, cast into a mold, cut into plates and polished to a thickness of 3 mm. Subsequently, the samples were subjected at room temperature to the mentioned aqueous acids, and after 10 minutes the etching removal was measured. The etching removal is determined with the help of the weight loss and converted to the sample surface.

TABLE 4

|  | Glass A | Glass A | Glass B | Solder A | Solder B | Solder C | Pb1 | Pb2 |
|---|---|---|---|---|---|---|---|---|
| crystalline additive [% by volume] | 0 | 0 | 0 | 14.3 | 7.3 | 14.3 | 0 | 0 |
| d50 [µm] | 7.3 | 7.3 | 1.5 | 1.5 | 2.5 | 2.5 | 8.5 | 7.5 |
| spread S = (d90 − d10)/d50 | 4.9 | 5.0 | 1.6 | 1.5 | 2.1 | 2.0 | 5.7 | 5.3 |
| melting temperature [° C.] | 685 | 650 | 740 | 740 | 740 | 740 | 690 | 670 |
| etching rate 20% $HNO_3$ [µm/min] | 17.2 | 17.4 | 7.4 | 4.4 | 6.6 | 5.3 | 0.2 | 21.2 |
| etching rate 5% HF [µm/min] | 13.2 | 13.9 | 11.9 | 13.0 | 9.3 | 8.9 | 1.7 | 16.1 |

From the comparison of glass A with glass B can be followed that a smaller grain size results in lower etching rates, in particularly in $HNO_3$. In addition, it has been shown that the crystalline additive improves the acid resistance.

Crystal Phases

An investigation was conducted, how the addition of a crystalline additive to the solder—here in form of the magnesium-aluminum-silicate $Mg_2Al_4Si_5O_{18}$—influences the composition of a passivation layer which has been prepared from the melt solder. The crystal phases in the passivation layer were determined by XRD analysis (X-ray diffraction) at molten test specimens. The melting temperature was 700 to 750° C. The quantitative determination of the respective crystal phases was conducted via a Rietveld simulation. The amorphous portions were determined by comparison with the internal standard $CaF_2$ with known crystal phases ("spiking method"). The results are shown in the following table.

TABLE 5

|  | Glass B | Solder A | Solder C | Solder B | Glass C |
|---|---|---|---|---|---|
| $Mg_2Al_4Si_5O_{18}$ [% by volume] | 0 | 14.3 | 14.3 | 7.3 | 0 |
| magnesium [% by mole] | 0 | 2.8 | 2.8 | 1.3 | 0 |
| aluminum [% by mole] | 0.4 | 3.0 | 3.0 | 1.7 | 0 |
| sum Mg + Al [% by mole] | 0.4 | 5.8 | 5.8 | 3.0 | 0 |
| grain size d50 [μm] | 1.5 | 1.5 | 2.5 | 2.5 | ribbon |
| amorphous portion [% by weight] | 54% | 85% | 88% | 66% | 100% |
| Composition of crystalline portion [% by weight] | | | | | |
| willemite | 27.3% | 1.9% | 0.8% | 16.3% | 0 |
| zinc silicate | 0% | 10.1% | 7.0% | 0% | 0 |
| $Zn_3B_6O_{13}$ | 17.6% | 0% | 0% | 17.6% | 0 |
| $Zn_4B_6O_{13}$ | 0.7% | 0% | 0% | 0% | 0 |
| cristobalite | 0% | 1.6% | 1.0% | 0% | 0 |
| $SiO_2$ | 0% | 1.1% | 0.6% | 0% | 0 |
| cordierite | 0% | 0.6% | 2.9% | 0% | 0 |
| crystalline portion [% by weight] | 46% | 15% | 12% | 34% | 0% |
| crack formation | yes | no | no | no | n.d. |

Figure 5A:
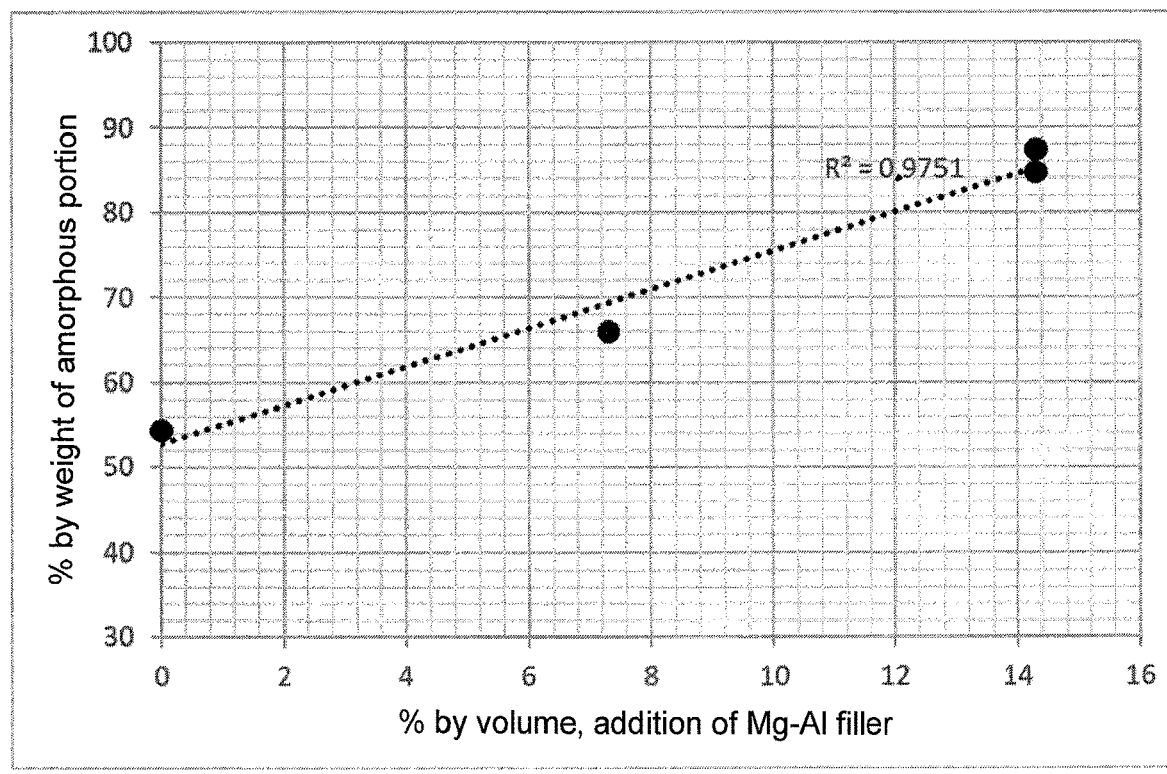
FIG. 5A shows the dependence of the amorphous portion in a passivation layer, dependent on the used amount of crystalline additive in the melt solder.
Figure 5B:
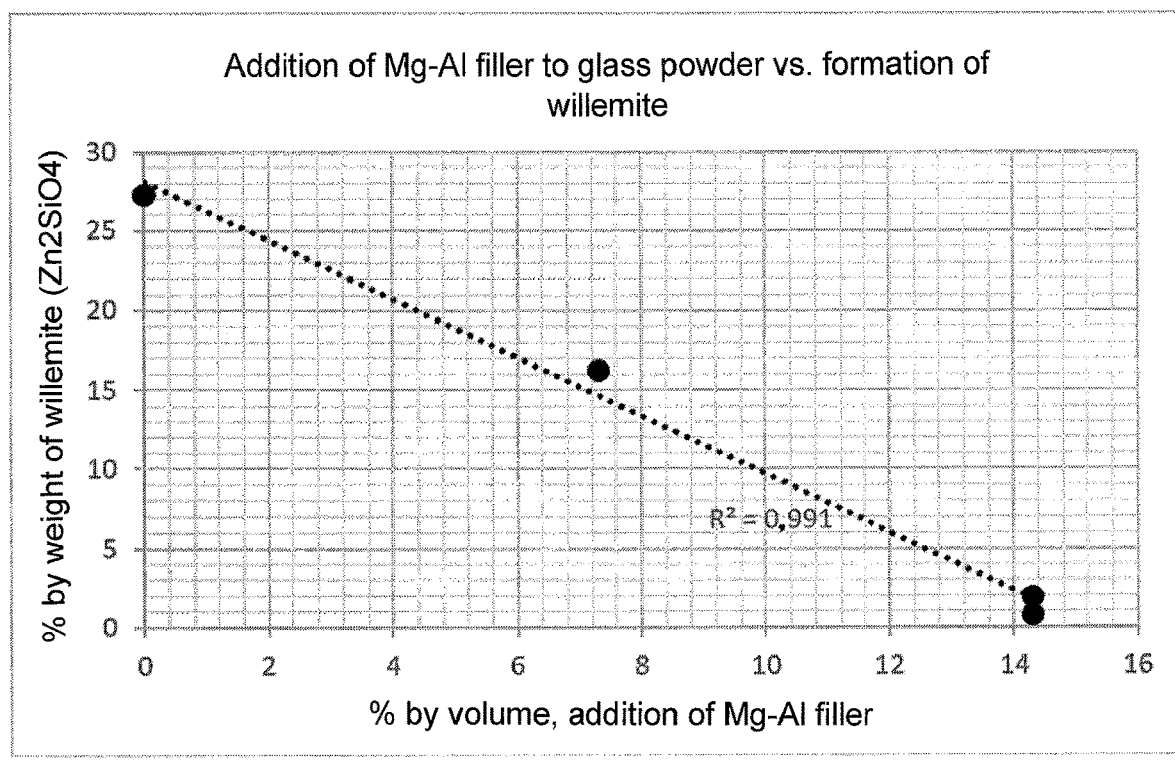
FIG. 5B shows the dependence of the portion of willemite crystal phase in a passivation layer, dependent on the used amount of crystalline additive in the melt solder.

It has been found that the amorphous portion in the samples increases with the addition of magnesium and aluminum. The strong correlation of the portion of magnesium and aluminum containing filler with the amorphous portion is shown in FIG. 5A. The influence of the amount of crystalline additive onto the willemite portion is shown in FIG. 5B. Glass C was not remelted. In the case of glass C no crystallization occurred.

It is assumed that a high portion of amorphous phase and in particularly a low portion of willemite in the crystalline phase have an influence onto the crack formation, when semiconductors are passivated. So, in the case of a low portion of amorphous phase crack formation was observed. In the case of a higher amorphous portion, e.g., 66% or more, no cracks were observed. The inventors assume that the formation of different crystal phases compromises the homogeneity of the solder. Furthermore, the crystal phases have a higher density than the glass so that during cooling voids can be formed which compromise the mechanical stability. Therefore, a higher amorphous portion is to be preferred.

Dynamic Differential Calorimetry (DSC)

Figure 6:
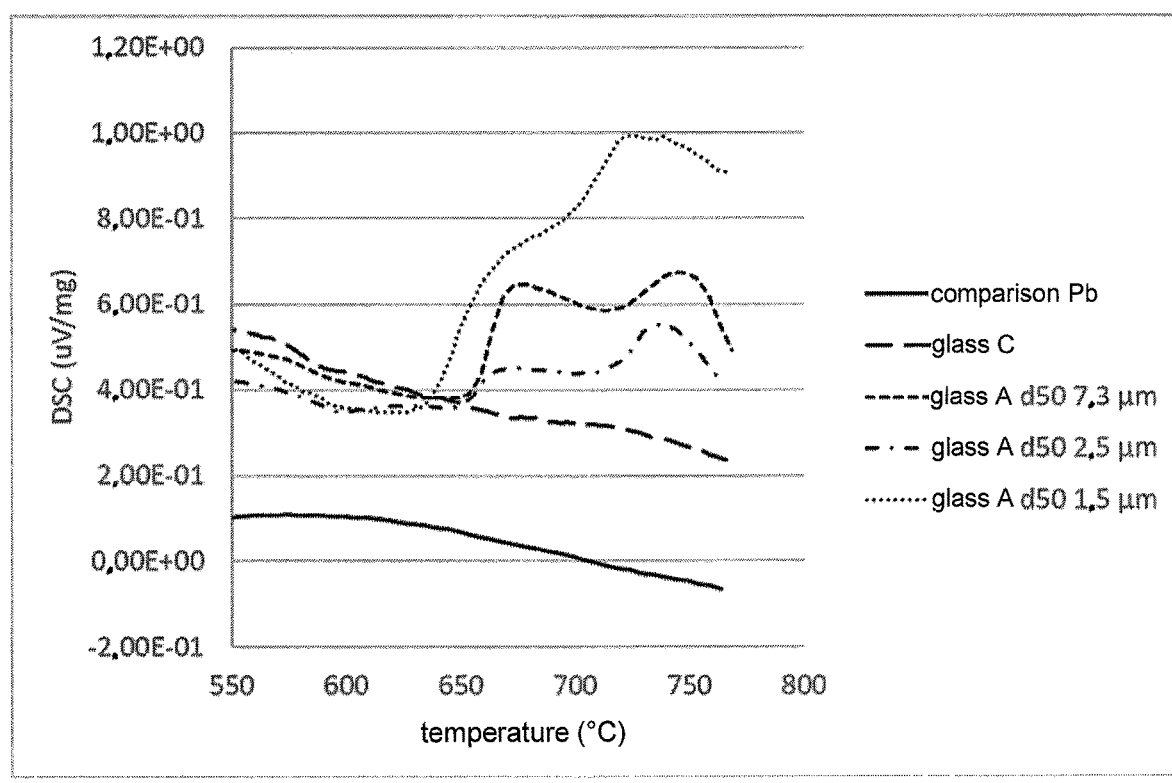
FIG. 6 shows the result of a DSC measurement of different glasses and melt solders.

It has been investigated insofar the particle size of a glass or solder influences its crystallization behavior. The investigation was conducted by means of dynamic differential calorimetry (DSC). The following table lists at which temperature due to an exothermic crystallization a peak and/or a shoulder in the DSC curves has been formed. FIG. 6 shows the diagram. As temperature profile 10 K/min up to 500° C. and then 5 K/min up to 770° C. were chosen for approximating it to the processing steps in the semiconductor industry as far as possible.

TABLE 6

|  | Glass D | Glass D | Glass D |
|---|---|---|---|
| crystalline additive [% by volume] | 0 | 0 | 0 |
| d50 [μm] | 7.3 | 2.5 | 1.5 |

TABLE 6-continued

|  | Glass D | Glass D | Glass D |
|---|---|---|---|
| 1. peak/shoulder | 674° C. | 670° C. | 670° C. |
| 2. peak/shoulder | 744° C. | 740° C. | 720° C. |

The data show that the grain size has an influence onto the formation of crystal phases. In the case of the sample with a particle size of 1.5 μm strong shrinkage occurred during the passivation of semiconductors. Possibly, crystal phases having a very high density are formed. A strong shrinkage results in cavities between passivation layer and semiconductor. When larger particles are used, when the particles are limited to <1.0 μm and/or when a glass or solder with a higher spread is used, then this effect can presumably be avoided or reduced.

Packing Density

Figure 4:
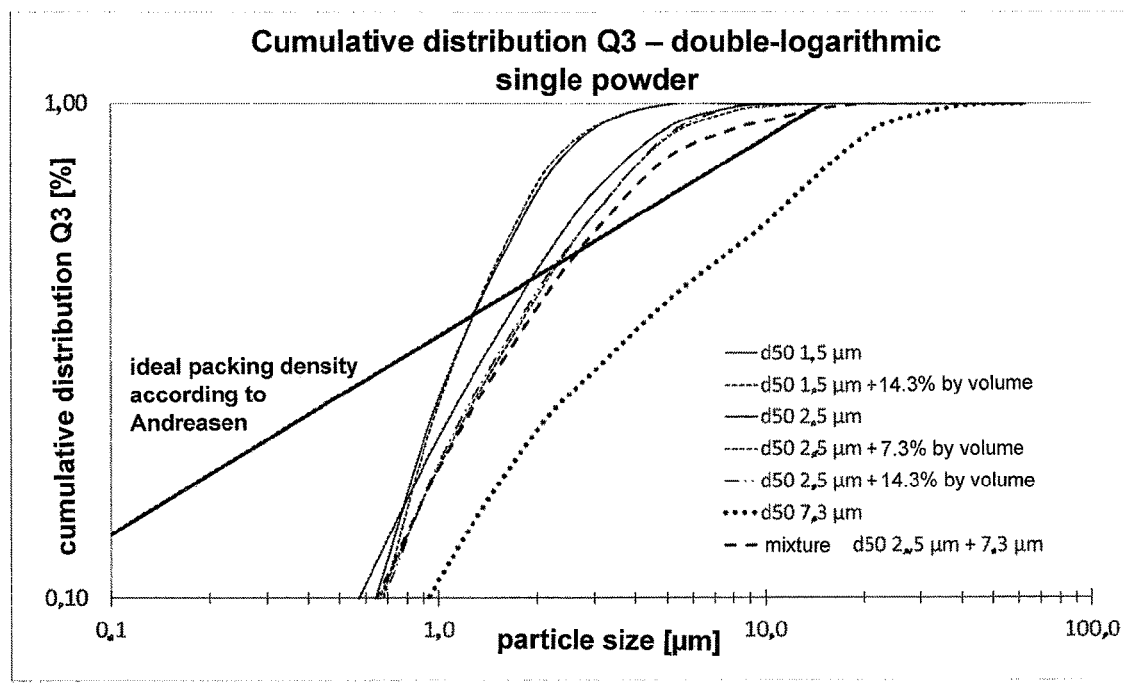
FIG. 4 shows the packing density of the powders with different grain sizes. The ideal line is according to Andreasen (Andreasen, A. H. M.: Über die Beziehung zwischen Kornabstufung und Zwischenraum in Produkten aus losen Körnern (mit einigen Experimenten). Kolloid-Zeitschrift, 1930. 50: p. 217-228.).

A high packing density is advantageous, because the shrinkage, when melted down, is lower in the case of a high packing density. A high shrinkage results in more cavities between passivation layer and semiconductor. FIG. 4 shows the packing density of different glasses and solders according to Andreasen, A. H. M.: Über die Beziehung zwischen Kornabstufung and Zwischenraum in Produkten aus losen Kornern (mit einigen Experimenten). Kolloid-Zeitschrift, 1930. 50: p. 217-228. It can be seen that coarser powders allow a better packing density.

What is claimed is:

1. A glass powder comprising the following constituents in % by mole:

| $SiO_2$ | 15.0 to 30.0 |
| $Al_2O_3$ | 0.0 to 8.0 |
| $B_2O_3$ | 14.0 to 25.0 |
| ZnO | 43.0 to 65.0 |
| MgO | 0.0 to 8.0 | wherein the glass powder has a particle size distribution that is characterized by a spread (d90–d10)/d50 of at least 1.80 and at most 6.00,
wherein the glass powder has a mean particle size d50 of 1.0 μm to 10.0 μm,
wherein the volume portion of particles with sizes below 1.0 μm is limited to at most 30% by volume of the glass, and
wherein the sum of the contents of $SiO_2$ and ZnO in the glass is at least 73.0% by mole.

2. The glass powder according to claim 1, wherein the glass powder has an average thermal expansion which in a temperature range of 300° C. to Tg–20° C. does not differ from the average thermal expansion of polycrystalline silicon by more than 0.90 ppm/K, wherein Tg is the glass-transition temperature of the glass and the thermal expansion is measured at a test specimen of 5×5×50 mm after melting the glass at a temperature of 700 to 750° C.

3. The glass powder according to claim 1, wherein the glass powder has a glass-transition temperature Tg of at least 550° C.

4. The glass powder according to claim 1, wherein the glass powder displays an etching rate of less than 20.0 μm/min in a 20% $HNO_3$ solution and/or less than 15.0 μm/min in a 5% HF solution at 20° C.

5. The glass powder according to claim 1, comprising Na, K, Li, Cs, Rb, Cu, Hg, Cd, Cr and/or Fe in a portion of at most 100 ppm.

6. The glass powder according to claim 1, comprising less than 1.0% by mole of $Bi_2O_3$, less than 100 ppm of PbO, less than 50 ppm of $As_2O_3$ and/or less than 50 ppm of $Sb_2O_3$.

7. A semiconductor component comprising a passivation layer made of a glass powder according to claim 1.

8. The glass powder according to claim 1, wherein the content of $Al_2O_3$ is at most 3.0% by mole.

9. The glass powder according to claim 1, wherein the amount of BaO is less than 100 ppm, and wherein the amount of CaO is less than 100 ppm.

10. A glass powder comprising the following constituents in % by mole:

| | |
|---|---|
| $SiO_2$ | 15.0 to 30.0 |
| $Al_2O_3$ | 0.0 to 3.0 |
| $B_2O_3$ | 14.0 to 25.0 |
| ZnO | 40.0 to 65.0 |
| MgO | 0.0 to 8.0 | wherein the glass powder has a particle size distribution that is characterized by a spread (d90–d10)/d50 of at least 1.80 and at most 6.00, wherein the glass powder has a mean particle size d50 of 1.0 μm to 10.0 μm, and wherein the volume portion of particles with sizes below 1.0 μm is limited to at most 30% by volume of the glass.

11. The glass powder according to claim 10, wherein the glass powder has an average thermal expansion which in a temperature range of 300° C. to Tg–20° C. does not differ from the average thermal expansion of polycrystalline silicon by more than 0.90 ppm/K, wherein Tg is the glass-transition temperature of the glass and the thermal expansion is measured at a test specimen of 5×5×50 mm after melting the glass at a temperature of 700 to 750° C.

12. The glass powder according to claim 10, wherein the glass powder has a glass-transition temperature Tg of at least 550° C.

13. The glass powder according to claim 10, wherein the glass powder displays an etching rate of less than 20.0 μm/min in a 20% $HNO_3$ solution and/or less than 15.0 μm/min in a 5% HF solution at 20° C.

14. The glass powder according to claim 10, comprising Na, K, Li, Cs, Rb, Cu, Hg, Cd, Cr and/or Fe in a portion of at most 100 ppm.

15. The glass powder according to claim 10, comprising less than 1.0% by mole of $Bi_2O_3$, less than 100 ppm of PbO, less than 50 ppm of $As_2O_3$ and/or less than 50 ppm of $Sb_2O_3$.

16. A semiconductor component comprising a passivation layer made of a glass powder according to claim 10.

* * * * *